United States Patent [19]

Tsironis

[11] Patent Number: 4,605,909

[45] Date of Patent: Aug. 12, 1986

[54] DUAL GATE FET OSCILLATOR MIXER

[75] Inventor: Christos Tsironis, Montgeron, France

[73] Assignee: U.S. Philips Corporation, New York, N.Y.

[21] Appl. No.: 343,147

[22] Filed: Jan. 28, 1982

[30] Foreign Application Priority Data

Jan. 28, 1981 [FR] France .................. 81 01618

[51] Int. Cl.$^4$ .............................................. H03B 5/18
[52] U.S. Cl. ................... 331/96; 331/117 FE; 331/117 D; 455/325; 455/333
[58] Field of Search ............ 331/96, 99, 117 FE, 331/117 D, 37, 42; 455/318, 319, 321, 322, 323, 325, 326, 327, 333

[56] References Cited

U.S. PATENT DOCUMENTS

| | | | |
|---|---|---|---|
| 4,112,373 | 9/1978 | Miyamoto et al. | 455/321 |
| 4,563,772 | 1/1986 | Beneking et al. | 455/321 |

FOREIGN PATENT DOCUMENTS

| | | | |
|---|---|---|---|
| 0011506 | 2/1978 | Japan | 455/333 |
| 0030206 | 3/1980 | Japan | 331/117 D |
| 0121706 | 9/1980 | Japan | 331/117 D |

OTHER PUBLICATIONS

Podcameni, A. et al., "Stabilized FET Oscillator with Input Dielectric Resonator: Large Signal Design" Electronics Letters, Jan. 8, '81, vol. 17, No. 1, pp. 44–45.
Tsironis, C. et al., "A Self-Oscillating Dual Gate MESFET X-Band Mixer with 12 DB Conversion Gain" Proc. 8th European Microwave Conference, Brighton, 1979, pp. 321–325.
Tsironis, C., "12 GHz Receiver with Self-Oscillating Dual-Gate MESFET Mixer" Electronics Letters, vol. 17, #17 (Aug. 20, 1981) pp. 617–618.
Stahlmann, R. et al. "Dual-Gate MESFET Self-Oscillating X-Band Mixers" Electronics Letters, vol. 15, #17 (Aug. 16, 1979) pp. 524–526.

Primary Examiner—Eugene R. LaRoche
Assistant Examiner—D. C. Mis
Attorney, Agent, or Firm—Robert J. Kraus

[57] ABSTRACT

An oscillator-mixer arrangement including a dual-gate field effect transistor of the Schottky type for supplying an intermediate frequency output signal. The output signal is obtained by subtractively mixing a high frequency input signal and a signal produced in the arrangement. The input signal is applied to the first gate electrode ($G_1$), the produced signal is controlled by the second gate electrode ($G_2$), and the output signal is recovered at the drain electrode (D), while the source electrode (S) is directly connected to ground. A microstrip line having a characteristic impedance $Z_O$ which is electromagnetically coupled to a dielectric resonator and loaded by an impedance ($Z_O$) is connected to the second gate electrode ($G_2$). The arrangement is intended to be included in a receiver front end assembly for very high frequency waves, typically of a frequency of 12 GHz, used for broadcasting radio-television programs by artificial satellites.

6 Claims, 6 Drawing Figures

DUAL GATE FET OSCILLATOR MIXER

BACKGROUND OF THE INVENTION

The invention relates to an oscillator-mixer arrangement comprising a dual-gate field effect transistor of the Schottky type, intended to supply an output signal of a frequency which is commonly referred to as an intermediate frequency. The output signal is obtained by subtractively mixing a high frequency input signal and a locally produced signal. The input signal is applied to the first gate electrode ($G_1$), and the locally produced signal is controlled by the second gate electrode ($G_2$). The output signal is recovered at the drain (D), while the source (S) is directly connected to ground. The arrangement is used in the field of very high frequency circuits, more specifically the reception of very high frequency waves.

Such a circuit is intended to be incorporated in a front end assembly receiving very high frequency waves, typically having a frequency of 12 GHz, used in the distribution of radio-television programs by means of artificial satellites. These programs can be received by ground-based receiving stations of a comparatively large size, thereafter broadcasted by local networks, or by small community stations serving schools, information centers or houses, and even individuals, particularly in the regions which are not covered by ground-based transmitter networks.

In general, a front end forms the interface between the receiving aerial and the receiver circuits of the television set. It functions to amplify the signal coming from the aerial and to reduce its frequency from 12 GHz to 1 GHz. Front end "assembly" is to be understood to mean that it is formed by integrated circuits, typically by field effect transistors, of gallium arsenide, because of their good very high frequency performance.

Reducing the frequency, from 12 GHz, the frequency assigned by the CCIR to telecommunication by means of artificial satellites, to 1 GHz, the intermediate frequency before demodulation by the circuit of the television receiver, is known from the prior art. It generally requires the presence of a local oscillator having a frequency of approximately 11 GHz, and a mixer from whose output a 1 GHz signal is derived. The respective circuit diagrams of a local oscillator and a mixer, published in Inter Electronique dated Apr. 28, 1978 is mentioned by way of example.

The ever-increasing degree of integration of the receiving front end dictated by the necessity to reduce the manufacturing cost of such a system, has induced applicant to search for a component which combines the functions of mixer and oscillator.

The dual-gate field effect transistor of the Schottky type is suitable for that purpose. From the prior art it is known to use it as a mixer, and the publication entitled: "An X-Band Dual Gate Fet Mixer", by S. C. Cripps et al, Proc. 1977 European Microwave Conference is mentioned as an example. Its use as an oscillator-mixer is also known, and the publication entitled: "A self oscillating dual gate Mesfet X-Band Mixer, with 12 dB conversion gain", by C. Tsironis et al, in the 8th European Microwave Conference Dig. Techn. Papers, Brighton, England, published in September 1979 is mentioned as an example.

In accordance with the last-mentioned publication the second gate electrode of a dual gate MESFET transistor is connected to a line of the variable-length microstrip type, whose end is short-circuited.

This device effectively forms an oscillator-mixer, however, it has the disadvantage that it cannot be stabilized by means of a resonator and for that reason its oscillating frequency is comparatively unstable, which makes impossible its use in the front end for receiving very high frequency waves for television.

SUMMARY OF THE INVENTION

It is an object of the invention to obviate the above-mentioned drawback by proposing a different construction which can be properly stabilized.

According to the present invention the oscillator-mixer device is characterized in that a line of the microstrip type having a characteristic impedance $Z_0$ and being electromagnetically coupled to a dielectric resonator and loaded by an impedance ($Z_0$), is connected to the said second gate electrode ($G_2$).

In this manner the transistor generates a signal whose frequency is the resonant frequency of the dielectric resonator.

In a specific use of the device in accordance with the present invention it functions as a simple oscillator.

In accordance with a preferred embodiment of the oscillator-mixer device the input and the output are adapted to operating frequencies which are used in order to increase the conversion gain.

In accordance with a preferred embodiment of the oscillator device the input and the output are adapted to the selected oscillation frequency, in order to increase the oscillation strength.

BRIEF DESCRIPTION OF THE DRAWING

The following description which is given by way of example with reference to the accompanying drawing will make it better understood how the invention can be put into effect and its advantages.

DESCRIPTION OF THE PREFERRED EMBODIMENT

Figure 1:
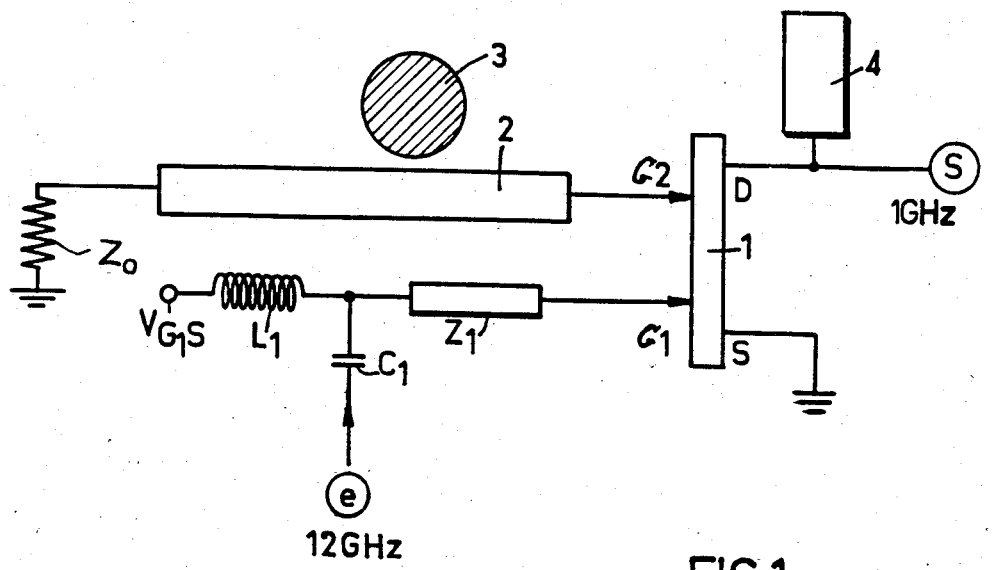
FIG. 1 is a circuit diagram of the oscillator-mixer in accordance with the present invention.

An oscillator-mixer arrangement in conformity with the present invention comprises a dual-gate field effect transistor of the Schottky type ("dual-gate MESFET") denoted by reference numeral 1 in FIG. 1, which is the active element of both the oscillator and the mixer.

Such a transistor is well-known from the prior art and by way of example we mention the article "Dual-Gate Gallium Arsenide Microwave Field-Effect Transistor", published by J. TURNER et al, in Electronic Letters, Volume 7, pages 661–662, November 1971. Its extremely diverse applications are however only quite recent, and have been made public from 1975 up to the present, while its use as an oscillator-mixer dates from 1979.

In the latter application the input signal is preferably applied to its first gate electrode ($G_1$) considered from the source (S), and the created signal is controlled by the second gate electrode ($G_2$), while the output signal is recovered at the drain (D).

This arrangement seems indeed to be the most advantageous, as appears from the information contained in the publication in International IEEE Microwave Symposium (Ottawa, June 27-29, 1978) at pages 309–311 of the article by P. T. Chen et al entitled: "Dual-gate GaAs FET As A Frequency Multiplier At Ku-Band". Particular reference is made to the transconductance curves as a function of the polarizing voltages of the first gate electrode with respect to the source ($V_{G1S}$), for different polarising voltages of the second gate electrode with respect to the source ($V_{G2S}$). The inverse arrangement is also possible without departing from the scope of the present invention, but is less advantageous.

Therefore, the self oscillating mixer device 1 shown in FIG. 1, comprises a source electrode (S) which is directly connected to ground; a first gate electrode ($G_1$) to which the high frequency (12 GHz) input signal received, for example, from the artificial satellite is applied via a capacitor $C_1$ and an impedance $Z_1$, and to which the bias voltage $V_{G1}$ is applied via an inductance $L_1$ and the impedance $Z_1$; a second gate electrode ($G_2$) which, in accordance with the present invention, is connected to a first end of a micro-strip line 2, having a characteristic impedance $Z_0$, typically of 60 Ω, the other end being loaded by an impedance $Z_0$ having the same value, while the line 2 is electromagnetically coupled to a dielectric resonator; and, finally, a drain electrode (D) from which the output signal is obtained at an intermediate frequency (for example 1 GHz). An open quarter-wave line 4, which behaves as a short-circuit for the frequencies of the input signal and of the created signal, is electrically-connected to the drain electrode.

The arrangement behaves as an oscillator by creating a signal whose frequency (for example 11 GHz) is stabilized by a dielectric resonator, and as a mixer by mixing the input signals, and provides filtering. At the output a signal is produced which is obtained by subtractive mixing, that is to say a signal whose frequency is the difference between the frequencies of the two signals applied to or controlled by the two gate electrodes ($G_1$ and $G_2$).

In this respect it may be useful to recall here that stabilizing the frequency of a signal by means of a dielectric resonator such as a ceramic disc made of $Ba_2.Ti_9.O_{20}$, or more generally of the $BaO$-$TiO_2$ system, is well-known from the prior art, particularly from the publication by J. K. PLOURDE et al, in the Journal of The American Ceramic Soc., Volume 58, pages 418–420, September–October 1975 in the article "$Ba_2.Ti_9.O_{20}$ as a Microwave Dielectric Resonator". In accordance with the invention, applicant provides a novel oscillating circuit comprising a dual-gate field effect transistor of the Schottky type, suitable for stabilization by this means.

The presence of this dielectric resonator, for example in the form of a barium titanate disc, accommodated in a closed metal box or mounted directly on the same aluminium oxide substrate as the transistor, renders it possible to obtain an external quality factor as high as 2000, and also to suppress any unwanted parasitic oscillation. In addition, this disc can be positioned with respect to the microstrip line in an easily reproducible manner.

Figure 2:
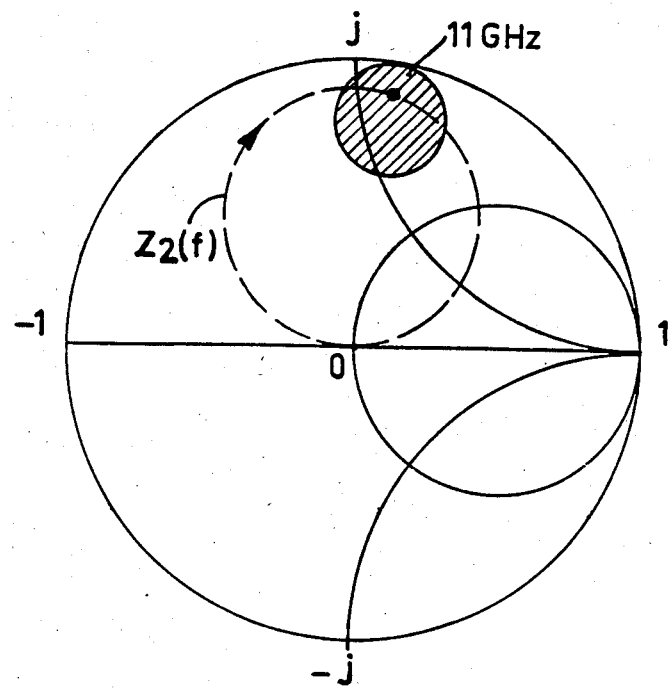
FIG. 2 shows the instability circle of the dual gate MESFET transistor at a selected frequency of, for example, 11 GHz, and the impedance seen by the second gate ($G_2$) as a function of the frequency, in the Smith chart.

The electromagnetic coupling between the dielectric resonator and the loaded microstrip line connected to the second gate ($G_2$) of the dual gate transistor has the following consequences:

the transistor oscillates at the resonant frequency of the dielectric resonator which is extremely temperature stable;

the transistor does not oscillate at other frequencies;

the transistor will not oscillate in the absence of the resonator. These consequences result from the fact that the impedance seen by the input, at this second gate electrode ($G_2$), passes through an instability zone of the transistor as shown in FIG. 2 in the Smith chart.

The impedance of the microstrip line, loaded by an impedance $Z_0$ (for example having a value of 50 Ω) and electromagnetically coupled to the resonator has the mathematical expression:

$$Z_2(f \neq f_0) = Z_0 = 50 \text{ Ω, and } Z_2(f=f_0) = e^{j\phi} \cdot 50 \text{ Ω},$$

wherein $f_0$ is the resonant frequency of the resonator, and $\phi$ the phase of $Z_2$.

The points which are representative of this impedance $Z_2(f)$ in the Smith chart includes the point 0, at the center of the chart, and the points lying on the almost circular loop which is shown by means of a broken line.

The hatched area represents the instability zone of the transistor at a given frequency; the zone being potentially unstable, as it does not contain the center of the chart, while $S_{22}$ (the coefficient of reflection at the output) is below unity ($|S_{22}|<1$).

In accordance with a preferred embodiment of the oscillator-mixer arrangement, by means of a suitable choice of the impedance at the input of the first gate electrode ($G_1$) and by means of the open quarter wave line 4, the arrangement is adapted to the frequency of the input signal (for example 12 GHz) and to the intermediate frequency output signal (for example 1 GHz) such that the conversion gain is maximum.

Figure 3:
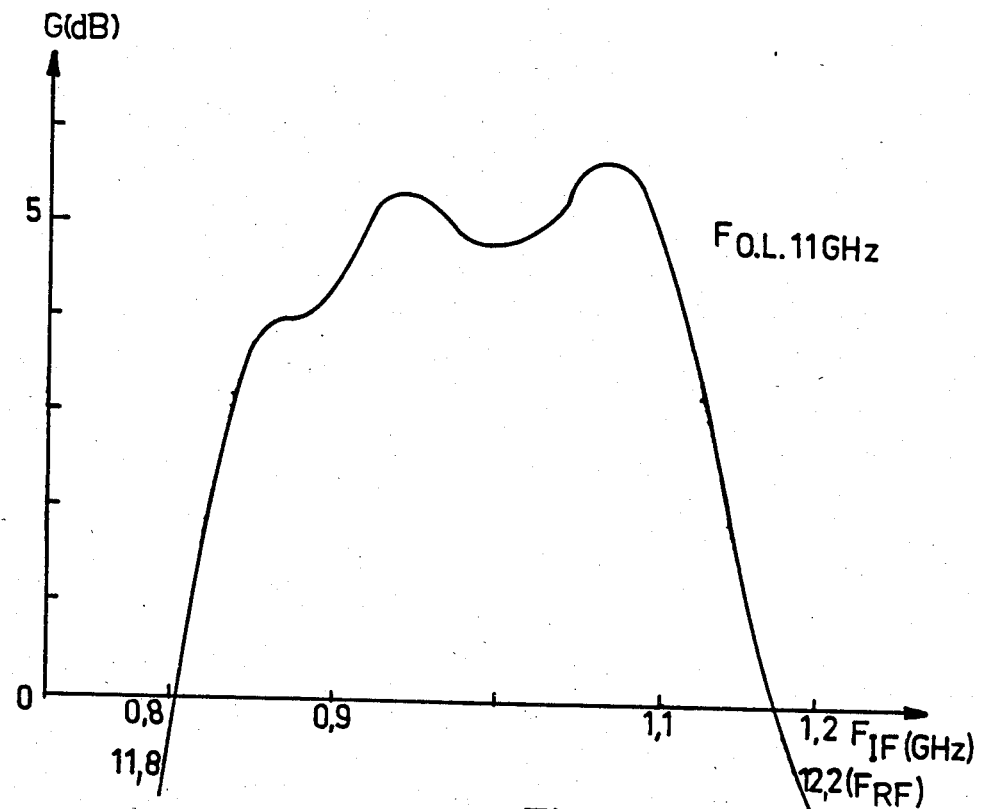
FIG. 3 shows a curve which represents the conversion gain as a function of the frequency of the received input signal.

For such an adapted circuit the conversion gain shown in FIG. 3 may reach approximately 5 dB, at an intermediate frequency lying between 0.9 and 1.1 GHz, for an input signal of 11.9 to 12.1 GHz.

Figure 4:
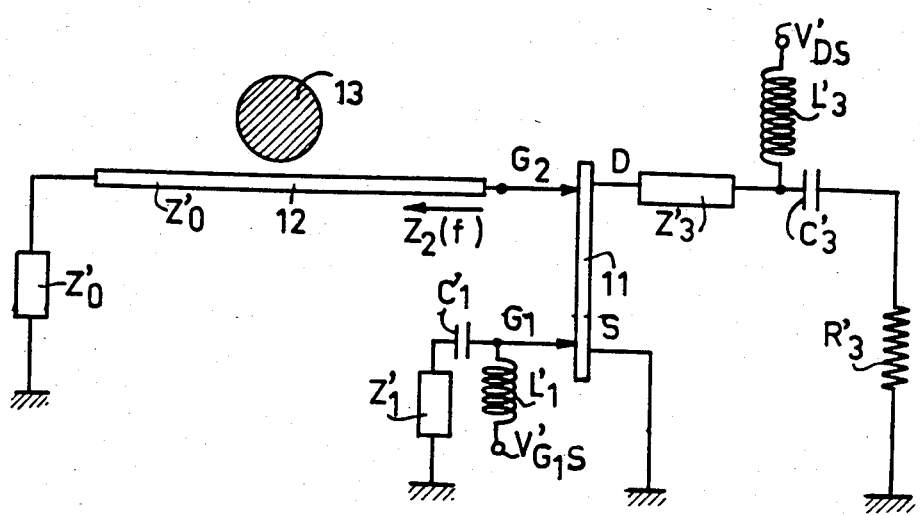
FIG. 4 is a circuit diagram of an oscillator in accordance with the present invention.

FIG. 4 shows another embodiment in which the arrangement forms a simple oscillator which is stabilized by a dielectric resonator. In accordance with this embodiment the oscillator comprises a dual-gate field effect transistor of the Schottky type, denoted by reference numeral 11. The source is connected to ground. The first gate electrode is connected to a bias voltage $V'_{G1S}$ via an inductance $L'_1$, and to ground via series-connected capacitor $C'_1$ and impedance $Z'_1$. The second gate electrode is connected to a first end of a microstrip line 12 having a characteristic impedance $Z'_0$ (typically 50 Ω), which is electromagnetically coupled to a dielectric resonator 13. The other end of the line 12 is loaded by an impedance of the same value $Z'_0$. The drain at which the oscillation signal is recovered is connected to ground via series-connected impedance $Z'_3$, capacitor $C'_3$ and load resistor $R'_3$, typically 50 Ω. The drain is connected to a bias voltage V'$_{DS}$ via the impedance Z'$_3$ and an inductance L'$_3$ connected at the junction of the impedance Z'$_3$ and the capacitor C'$_3$.

Figure 5:
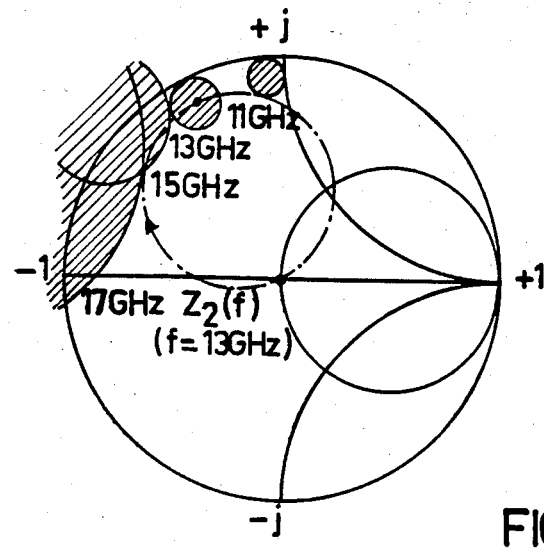
FIG. 5 shows the instability circles of the dual gate MESFET transistor and the impedance seen by the second gate ($G_2$) as a function of the frequency, in the Smith chart.

FIG. 5 shows, in the Smith chart, the several instability zones by means of hatched discs, each disc corresponding to a given frequency, for example 11 GHz, 13 GHz, 15 GHz and 17 GHz.

It should be noted that the centers of these discs move as a function of the frequency, in such a manner that the phase in the center of the disc increases with frequency, while the phase $\phi$ of Z$_2$(f) decreases with frequency, which renders the system more selective and imparts to the oscillator an even higher quality factor Q.

In accordance with a preferred embodiment of the oscillator, the impedances at the first gate electrode (G$_1$) and at the drain electrode (D) are chosen to optimize the oscillating conditions and to increase the oscillation strength supplied by the device to its maximum, respectively.

Figure 6:
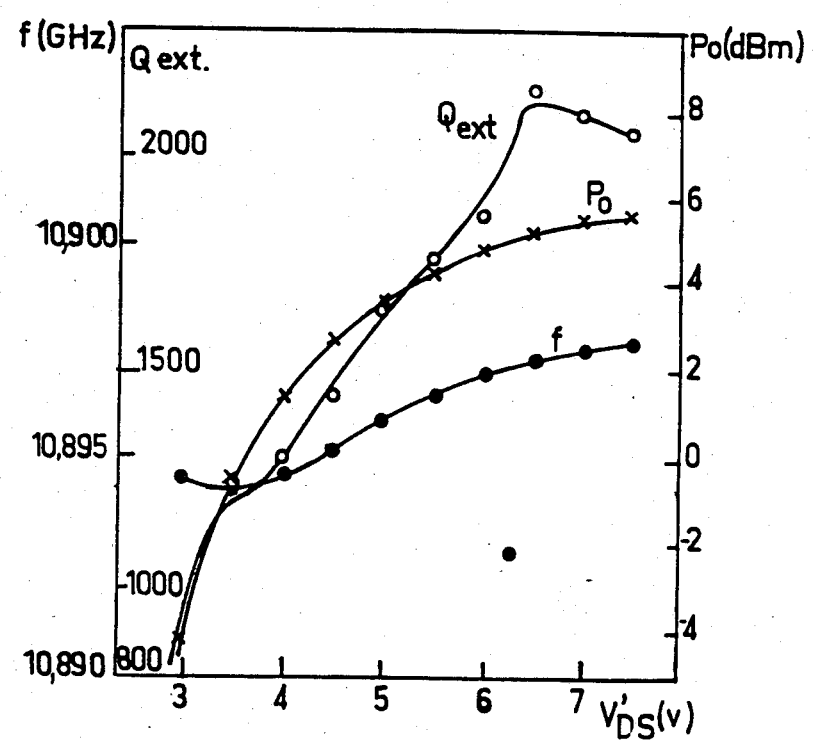
FIG. 6 shows a curve which represents the power supplied by the oscillator and the quality factor $Q_{ext}$ as a function of the polarization voltage applied to the drain electrode.

In this manner it has been possible to realize oscillators with dual-gate field effect transistors, stabilized by a dielectric resonator, in the frequency bands X and K$_u$, ranging between 8 and 18 GHz. The power applied to the load resistor may vary between 4 mW (17.8 GHz) and 18 mW (16.3 GHz). The quality factor and the oscillation power of this oscillator arrangement have been measured as a function of the bias voltage V'$_{DS}$ of the drain electrode, and are shown in FIG. 6.

It will be obvious to a person skilled in the art that many variants can be thought of without departing from the scope of the present invention as it is defined in the following claims.

What is claimed is:

1. A self-oscillating circuit arrangement comprising:
   (a) a dual-gate field effect transistor including first and second gate electrodes, a drain electrode and a source electrode;
   (b) a first input circuit comprising an input terminal, an input impedance electrically connected between said input terminal and the first gate electrode, and means for applying a bias voltage to said first gate electrode;
   (c) a second input circuit comprising a strip-type transmission line having one end electrically connected to the second gate electrode, said transmission line being terminated in a load having an impedance equal to the characteristic impedance of the line and being electromagnetically coupled to a dielectric resonator having a predetermined resonant frequency;
   (d) an output terminal coupled to the drain electrode; and
   (e) means electrically connected to the source electrode for referencing said electrode to a predetermined voltage;
   said circuit arrangement producing at the output terminal an output signal having a difference frequency equal to the difference between the frequency of an input signal applied to the input terminal and the resonant frequency.

2. A self-oscillating circuit arrangement as in claim 1 where the characteristic impedance is approximately equal to 50 ohms.

3. A circuit arrangement as in claim 1 or 2 including a strip-type quarter-wave open transmission line electrically connected to the drain electrode for eliminating frequencies other than the difference frequency from the output signal.

4. A circuit arrangement as in claim 1 or 2 where the input impedance has a magnitude which is selected to maximize the power conversion gain of said arrangement.

5. A circuit arrangement as in claim 1 or 2 where said input terminal is referenced to a DC voltage, said output signal having a frequency equal to the resonant frequency.

6. A circuit arrangement as in claim 5 including an output impedance electrically connected between the drain electrode and the output terminal, the magnitudes of the input impedance and said output impedance being selected to maximize the magnitude of the output signal.

* * * * *